(12) United States Patent
Arshad et al.

(10) Patent No.: US 11,756,794 B2
(45) Date of Patent: Sep. 12, 2023

(54) IC WITH DEEP TRENCH POLYSILICON OXIDATION

(71) Applicant: Texas Instruments Incorporated, Dallas, TX (US)

(72) Inventors: Shariq Arshad, Allen, TX (US); James Tyler Overton, Anna, TX (US); Divya Geetha Nair, Carrollton, TX (US); Helen Elizabeth Melcher, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 127 days.

(21) Appl. No.: 17/004,932

(22) Filed: Aug. 27, 2020

(65) Prior Publication Data

US 2021/0134602 A1    May 6, 2021

Related U.S. Application Data

(60) Provisional application No. 62/929,159, filed on Nov. 1, 2019.

(51) Int. Cl.
| | |
|---|---|
| *H01L 21/306* | (2006.01) |
| *H01L 21/3065* | (2006.01) |
| *H01L 21/762* | (2006.01) |
| *H01L 21/763* | (2006.01) |
| *H01L 49/02* | (2006.01) |

(52) U.S. Cl.
CPC .... *H01L 21/30625* (2013.01); *H01L 21/3065* (2013.01); *H01L 21/763* (2013.01); *H01L 21/76224* (2013.01); *H01L 28/40* (2013.01)

(58) Field of Classification Search
CPC . H01L 28/40; H01L 21/76224; H01L 21/763; H01L 21/76227; H01L 21/30625; H01L 21/02236; H01L 21/02238; H01L 29/945
See application file for complete search history.

(56) References Cited

U.S. PATENT DOCUMENTS

| | | | | |
|---|---|---|---|---|
| 4,666,556 A | * | 5/1987 | Fulton | H01L 21/76237 257/652 |
| 4,980,747 A | * | 12/1990 | Hutter | H01L 21/763 257/E21.538 |

(Continued)

*Primary Examiner* — Michael M Trinh
(74) *Attorney, Agent, or Firm* — Andrew R. Ralston; Frank D. Cimino (57) ABSTRACT

A method of fabricating an IC includes forming a layer stack thereon including silicon nitride layer on a first silicon oxide layer, with a second silicon oxide layer thereon on a substrate including a semiconductor material. The layer stack is etched to form ≥1 trench that is at least 2 microns deep into the semiconductor material. A dielectric liner is formed on sidewalls and a bottom of the trench. A polysilicon layer is formed on the dielectric liner that fills the trench and extends lateral to the trench. Chemical mechanical planarization (CMP) processing stops on the silicon nitride layer to remove the polysilicon layer and the second silicon oxide layer to form a trench structure having a polysilicon fill. After the CMP processing, thermal oxidation oxidizes exposed regions of the polysilicon layer to form a polysilicon oxide layer. After the thermal oxidizing, the silicon nitride layer is removed.

20 Claims, 8 Drawing Sheets

(56) References Cited

U.S. PATENT DOCUMENTS

| | | | | |
|---|---|---|---|---|
| 5,691,229 | A * | 11/1997 | Okamura | H01L 27/10852 |
| | | | | 148/DIG. 14 |
| 5,736,760 | A * | 4/1998 | Hieda | H01L 27/108 |
| | | | | 257/305 |
| 5,889,293 | A * | 3/1999 | Rutten | H01L 21/84 |
| | | | | 257/74 |
| 7,407,820 | B2 * | 8/2008 | Chiu | H01L 22/12 |
| | | | | 257/E21.267 |
| 9,401,410 | B2 | 7/2016 | Hu et al. | |
| 10,163,680 | B1 * | 12/2018 | Hu | H01L 21/743 |
| 10,243,047 | B2 * | 3/2019 | Shank | H01L 25/18 |
| 2007/0224757 | A1 * | 9/2007 | Cheng | H01L 29/66181 |
| | | | | 257/E21.396 |
| 2008/0268654 | A1 * | 10/2008 | Suzuki | H01L 21/67017 |
| | | | | 438/770 |
| 2011/0275168 | A1 * | 11/2011 | Davis | H01L 21/3212 |
| | | | | 438/693 |
| 2016/0308007 | A1 * | 10/2016 | Hu | H01L 21/02595 |
| 2017/0200712 | A1 * | 7/2017 | Strachan | H01L 29/861 |
| 2018/0130869 | A1 * | 5/2018 | Hu | H01L 21/26513 |
| 2018/0342416 | A1 * | 11/2018 | Such | H01L 21/76237 |

* cited by examiner

IC WITH DEEP TRENCH POLYSILICON OXIDATION

CROSS-REFERENCE TO RELATED APPLICATIONS

This application claims the benefit of Provisional Application No. 62/929,159 entitled "Enabling complete deep trench (DT) nitride removal and nitride stringer defect elimination by oxidizing DT poly", filed on Nov. 1, 2019, which is herein incorporated by reference in its entirety.

FIELD

This Disclosure relates to integrated circuits (ICs) having trenches in the semiconductor material that may be called deep trench (DT) structures that include DT isolation structures and/or DT-based capacitors.

BACKGROUND

One conventional structure for electrical isolation for devices on an IC utilizes DTs formed into the semiconductor substrate, such as a silicon substrate. The term "deep trench" (or "DT") as used herein refers to trenches that that have a depth of at least 2 μms. The DTs have at least one dielectric liner layer on at least its sidewalls for electrical isolation. There is commonly polycrystalline silicon (polysilicon) on the dielectric liner layer for filling the DT, commonly referred to as being polysilicon fill when inside the DT, where the polysilicon fill can be doped, such as in the case that electrical contact is being made to the DT. Alternatively, the polysilicon fill can be undoped.

DT isolation structures are conventionally shaped to provide an enclosure around a plurality of areas of the semiconductor substrate, such as the DT isolation structures being ring-shaped, for example, being rectangularly-shaped. Individual devices such as transistors are placed within the DT ringed areas of the semiconductor substrate which are referred to herein as being "moats". There can also be shallow trench isolation (STI) regions, with STI also being known as box isolation as the isolation pattern of STI encircles devices including transistors formed within the moats for isolating the respective devices from neighboring devices, that are positioned within the same moat.

The DTs can also be used to form DT-based capacitors. For DT-based capacitors, the polysilicon fill is doped, and there is a first surface contact (also known as an electrode or a plate) to provide contact to the polysilicon fill, and there is a second surface contact to contact the semiconductor material adjacent to the DT.

In one particular DT process flow, the flow starts with a pad oxidation (a thermal oxidation) of a substrate (generally in the form of a wafer) commonly comprising silicon, followed by a silicon nitride deposition, and then a hard mask oxide deposition. As known in the art of semiconductor fabrication, a hard mask material corresponds to material that is resistant to being removed by plasma etching. One known hard mask precursor material is tetraethyl orthosilicate, also called tetraethoxysilane (TEOS), which when heated in a chemical vapor deposition (CVD) apparatus forms silicon oxide which is known to contain some polysilicon besides silicon oxide, where the polysilicon provides resistance for the TEOS-derived silicon oxide material against being plasma etched.

DT formation generally comprises printing a photoresist pattern, and then etching using the photoresist pattern. The etching can etch through the hard mask oxide layer, through the silicon nitride layer, and through the pad oxide layer, and then anisotropically into the silicon substrate form a trench, generally 2 or more microns deep into the silicon substrate. The photoresist is generally then removed using an ashing process, followed by a wet clean.

After DT formation, a dielectric liner layer is formed for dielectric lining of the DTs. A polysilicon layer as deposited as a blanket layer, which has a deposited thickness so that it not only fills the DT but also extends lateral to the DT.

Chemical mechanical planarization (CMP) is then used to remove the polysilicon layer lateral to the DT to define the polysilicon fill, which is configured to stop on the silicon nitride layer. A hot phosphoric acid ($H_3PO_4$) etch process, including water mixed with phosphoric acid, typically performed at a temperature of about 150° C. to 190° C., follows directly after the CMP process. The phosphoric acid process is intended to strip off all the silicon nitride layer. An STI formation process can then follow to form STI region(s) within the moats, for providing isolation for the respective devices from neighboring devices in each moat.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include a method of fabricating an IC which includes forming a layer stack on a substrate, the layer stack including a silicon nitride layer on a first silicon oxide layer, with a second silicon oxide layer thereon. The substrate comprises a semiconductor material. The layer stack is etched to form at least one trench that is at least 2 microns deep into the semiconductor material. A dielectric liner is formed on sidewalls and a bottom of the trench. A polysilicon layer is formed on the dielectric liner that fills the trench and extends lateral to the trench. A chemical mechanical planarization (CMP) process stops on the silicon nitride layer to remove the polysilicon layer and the second silicon oxide layer to form a trench structure having a polysilicon fill. After the CMP processing, a thermal oxidation oxidizes exposed regions of the polysilicon layer to form a polysilicon oxide layer. After the thermal oxidizing, the silicon nitride layer is removed.

BRIEF DESCRIPTION OF THE DRAWINGS

Reference will now be made to the accompanying drawings, which are not necessarily drawn to scale, wherein:

FIG. 5B is both 5 µm.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

In an IC fabrication flows incorporating a DT isolation, there can be a high level of defects resulting from an incomplete silicon nitride layer strip, for example when a hot phosphoric acid etch process is used to remove the silicon nitride layer. Regions of this residual silicon nitride layer can deform the moats by forming liner oxide grooves, which can result in a yield loss, particularly for IC process flows having shallow trench isolation (STI) formed using a silicon nitride layer following the DT formation processing. Residual silicon nitride layer regions following the hot phosphoric acid etch can block the STI etch into the substrate which can result in bridging two neighboring moats together that can result in a high leakage current between the adjacent moats. Also, defects resulting from the presence of DT liner oxide grooves in the form of moat silicon nitride stringers from the silicon nitride deposition associated with the STI formation process have also been identified by the Inventors.

Without a disclosed oxidization of the exposed polysilicon fill, a groove in the DT's liner oxide layer(s) for the DT isolation is formed when a HF acid clean step is performed prior to the hot phosphoric acid process for DT silicon nitride removal. This liner oxide groove runs along the length (perimeter) of the DT, where the as noted above the liner oxide groove can get filled with the STI processes' silicon nitride layer. Even after an STI silicon nitride removal step (for example using hot phosphoric acid), the silicon nitride layer in the liner oxide grooves can get trapped and is thus not be removed as intended.

During a subsequent HF clean process such as, for example, before the "dummy" gate oxidation, the actual gate oxidation, and the silicide block cleans when the IC includes a silicide, the STI pad oxide layer under the trapped silicon nitride layer can get etched away, and this trapped silicon nitride layer can then lift-off analogous to a stringer defect. This silicon nitride stringer can be released and then become positioned over the moat's substrate material and/or the polysilicon regions in the moats which when present can block the silicide layer formation. The lack of a silicide layer can result in highly resistive electrical paths over the polysilicon and/or over the moat. The resulting increase in resistance due to silicon nitride stringers can result in an IC yield loss.

Disclosed DT processing utilizes a thermal oxidation of the exposed polysilicon fill of the trench generally being a DT formed in the substrate after the CMP step and before the hot phosphoric acid etch step to form a polysilicon oxide layer on the exposed polysilicon fill (that extends above the level of the substrate). A hot phosphoric acid etch may then be performed at about 150° C. to 190° C. to selectively etch the silicon nitride layer to ensure stripping off all the silicon nitride layer to eliminate the above-described problems caused by residual of the silicon nitride layer.

Figure 5A:
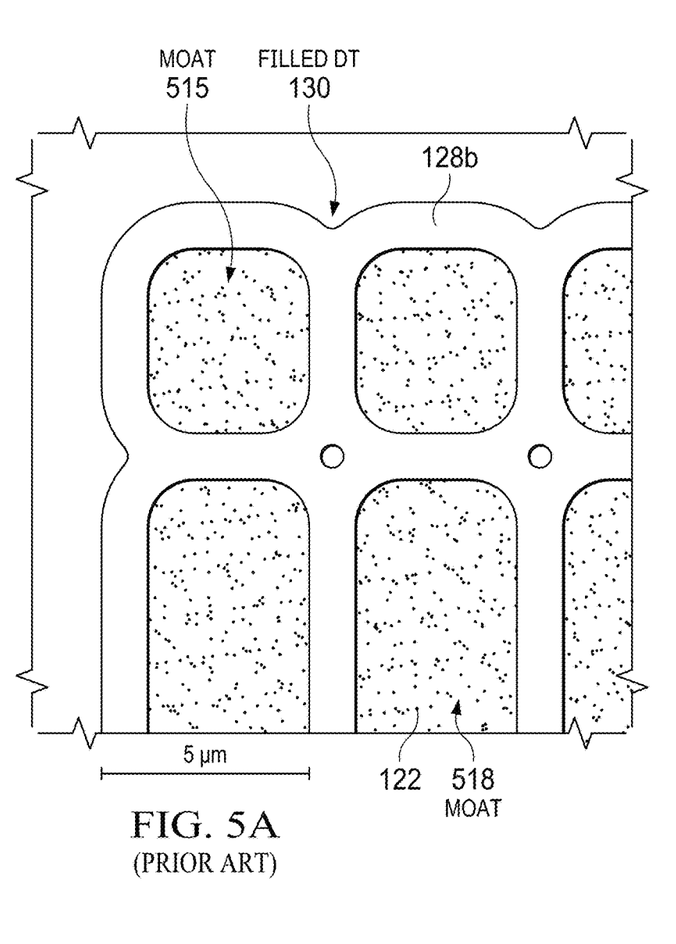
FIG. 5A is a scanned transmission electron microscope (TEM) image of a top side of an IC having DTs surrounding moats, the IC being shown after the hot phosphoric acid strip process that was intended to remove all of the silicon nitride layer, where there is shown in the respective moats remaining areas of the silicon nitride layer. The scale for FIG. 5A

This disclosed oxidation of the exposed polysilicon fill to form polysilicon oxide allows the subsequent hot phosphoric acid etching step to generally be able to etch away all the silicon nitride layer on the surface of the substrate. Without this additional thermal oxidation after CMP for the polysilicon fill, the hot phosphoric acid etch process can dilute the concentration of the hot-phosphoric acid solution locally, which can render the hot phosphoric acid etch ineffective in accomplishing its intended function of removing all the silicon nitride layer as shown in FIG. 5A in the Examples section described below.

Figure 6A:
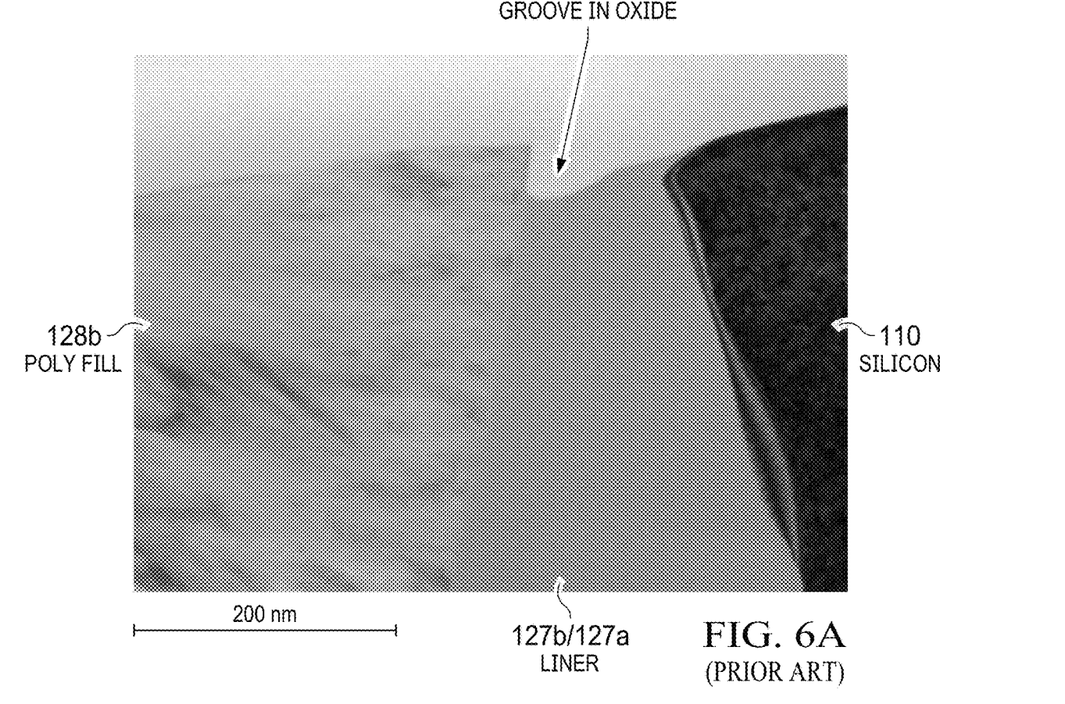
FIG. 6A is a scanned TEM image of a cross-section showing a DT after CMP showing a deep liner oxide groove next to polysilicon fill which enlarges during the pad oxide removal process. This groove traps the subsequent moat silicon nitride layer used for forming STIs, which is not removed after moat CMP followed by hot phosphoric acid processing. This FIG. 6A and FIG. 6B both have a 200 nm scale.
Figure 6B:
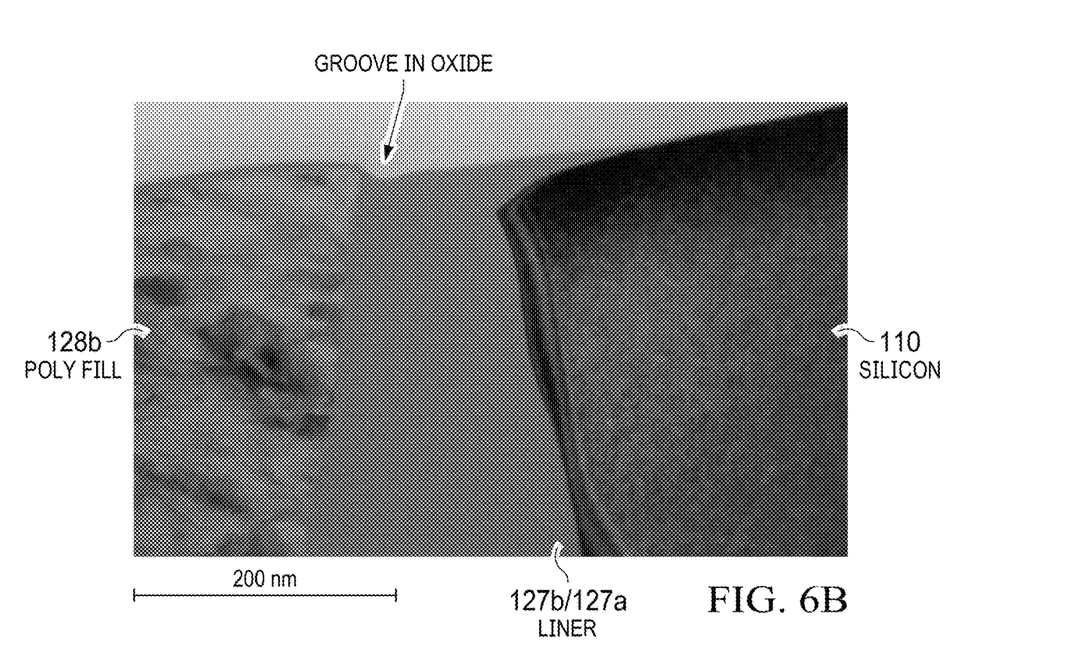
FIG. 6B is a scanned TEM image of a cross-section corresponding to the same cross-section shown in FIG. 6A that shows that the depth of the liner oxide groove is significantly less when a polysilicon oxide layer is grown as disclosed herein over the exposed surface of the polysilicon fill of the DT after the CMP but before the DT silicon nitride strip process.

Disclosed oxidation of exposed polysilicon fill before the hot phosphoric acid silicon nitride layer removal also makes the trench shown is a DT liner oxide groove smaller in depth, such as shown in FIG. 6B compared to the control trench shown as a DT process results which lacked a polysilicon fill oxidation process shown in FIG. 6A in the Examples section. Reducing the size of the liner oxide groove as described below which helps prevents trapping of the moat's silicon nitride used for the STI processing for ICs also having STI's, which generally results in essentially no silicon nitride stringer defects.

Figure 1:
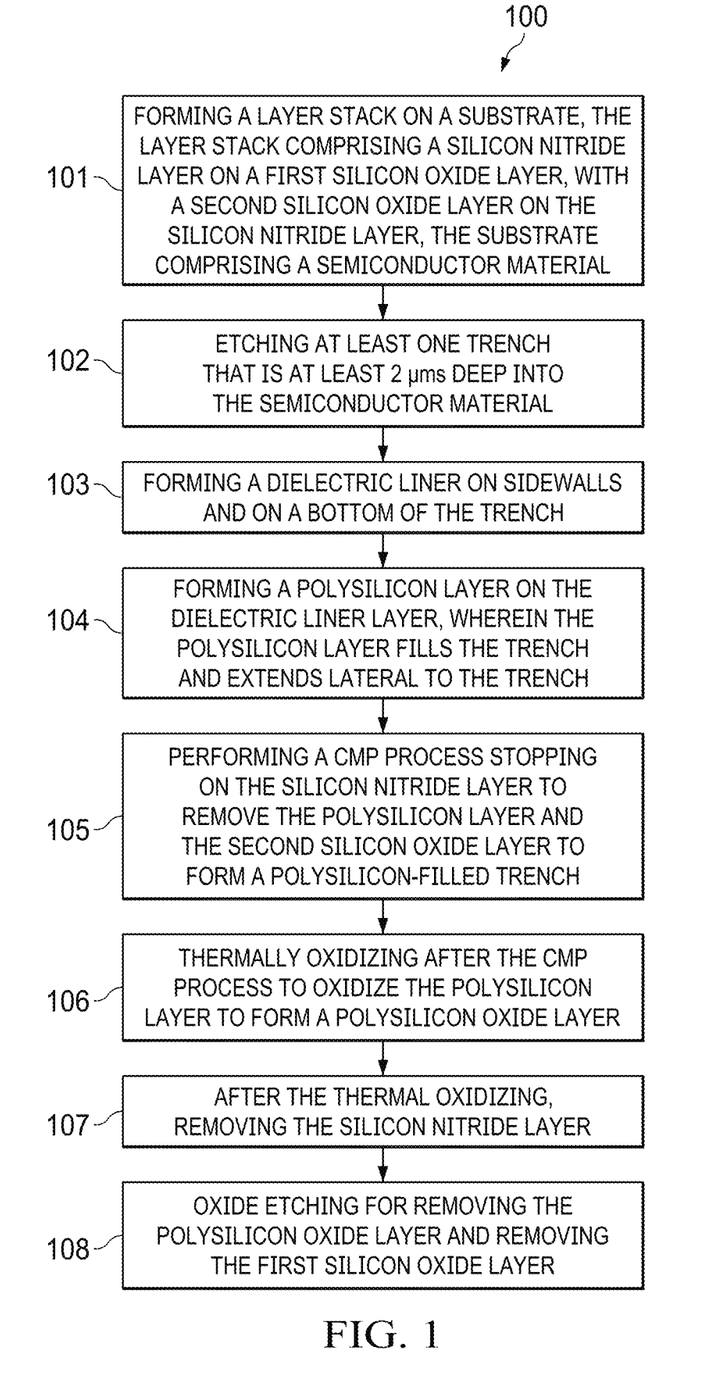
FIG. 1 is a flow chart that shows steps in an example method for forming an IC including trench processing for forming trench-based structures that include oxidizing the surface of the polysilicon fill of the trench before stripping off the silicon nitride layer, according to an example aspect.

FIG. 1 is a flow chart that shows steps in an example method 100 for forming an IC including trench processing that includes oxidizing the exposed surface of the polysilicon fill before stripping the silicon nitride layer, according to an example aspect. Method 100 can be used to form trench structures comprising DT isolation structures as well as DT-based capacitors. FIGS. 2A-2I are cross-sectional diagrams showing process progression for a method 100 that comprises forming trench structure(s) on an IC, where the IC includes MOS transistor(s).

Trench-based capacitors have at least one trench that utilize an analogous method including polysilicon fill oxidation before hot phosphoric acid etching of the silicon nitride layer to overcome the recognized problem of the hot phosphoric acid attacking the exposed trench capacitor polysilicon fill during silicon nitride removal making the contact resistance to the polysilicon fill higher than intended by the IC design. The same polysilicon fill oxidation step of forming a polysilicon oxide layer having a thickness of about 100 Å to 300 Å, such as 200 Å±30%, measured on a pilot wafer having light doping (meaning the doping level of ≤$10^{16}$ cm$^{-3}$) that shared the same oxidation process for forming the polysilicon oxide layer with the wafer having the ICs used to form trench-based isolation structures prior to the hot phosphoric acid etch process will similarly prevent the polysilicon fill of the trench-based capacitor(s) from being attacked by the hot phosphoric acid.

Step 101 comprises forming a layer stack thereon comprising a silicon nitride layer on a first silicon oxide layer, with a second silicon oxide layer on the silicon nitride layer, the layer stack formed on a substrate (e.g. a wafer) comprising a semiconductor material. As used herein, a silicon nitride layer can include some polysilicon, and can also include some silicon oxide, up to 5 weight % of each. A silicon nitride layer shown as 122 in FIG. 2A which is a cross-sectional diagram corresponding to the results after step 101, is used as an etch stop layer for a CMP process, where silicon nitride is known to generally have a k-value of about 2. The silicon nitride layer as known in the art can be plasma etched, then wet cleaned using a hot phosphoric acid solution, where the silicon nitride layer can also function as a CMP etch stop layer.

Figure 2A:
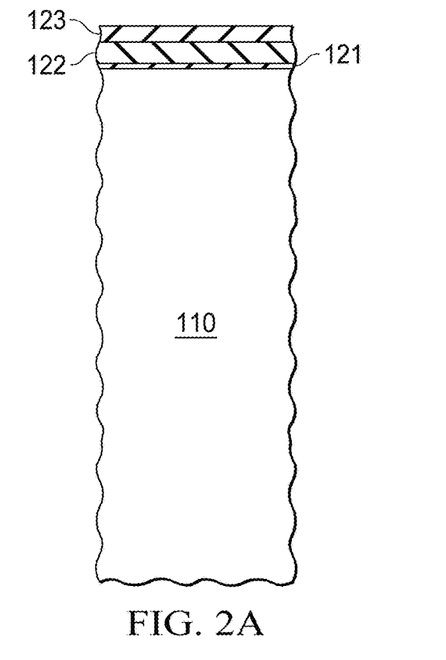
FIGS. 2A-2I are cross-sectional diagrams showing process progression for an example method of forming trench-based isolation includes oxidizing the surface of the polysilicon fill before stripping off the silicon nitride layer, for an IC having MOS transistor(s), according to an example aspect.

The silicon nitride layer 122 may advantageously be a low defect density layer and be an essentially particle-free layer. The silicon nitride layer 122 as shown in FIG. 2A is on top of a first silicon oxide layer which is referred to herein as being a pad oxide layer 121, with a second silicon oxide layer 123 sometimes referred to as a hard mask layer on top of the silicon nitride layer 122. The second silicon oxide layer 123 can, for example, comprise a TEOS-derived silicon oxide layer or a high-density plasma (HDP) oxide layer on the silicon nitride layer 122. These three dielectric layers are collectively referred to herein as being a layer stack.

FIG. 2A also shows a substrate 110 comprising a semiconductor material, such as silicon, having an un-patterned layer stack thereon comprising the silicon nitride layer 122, on the pad oxide layer 121, with the second silicon oxide layer 123 (that may be regarded as being a hard mask layer) on top of the silicon nitride layer 122. The substrate 110 can comprise silicon, silicon-germanium (SiGe), or other semiconductor material. One particular arrangement for the substrate 110 is an epitaxial silicon layer on a bulk silicon substrate. Other example semiconductor materials can include SiGeC, SiC, GaAs, InAs, InP, and other III/V or II/VI compound semiconductors. The substrate 110 can include at least one buried layer.

The pad oxide layer 121 generally comprises a layer of thermal silicon oxide, that may be about 5 nanometers to 30 nanometers thick. The silicon nitride layer 122 on the pad oxide layer 121 may be deposited by a process comprising low pressure chemical vapor deposition (LPCVD), using ammonia and silane, which may also be deposited using a plasma-enhanced LPCVD (PECVD) process.

The silicon nitride layer 122 may be 100 nanometers to 300 nanometers thick. The second layer of silicon oxide 123 may also be formed by a process comprising PECVD, such as using a TEOS-based process, or using an HDP oxidation process. The second layer of silicon oxide 123 may be 500 nanometers to 2 microns thick. The silicon nitride layer 122 as described above can provide an etch stop for a subsequent CMP process.

Step 102 comprises etching at least one trench that is at least 2 μms deep into the semiconductor material shown as a substrate 110, where the trench based on its depth being at least 2 μms deep as described above may be referred to as being a DT. For DT isolation the DT may be at least 5 microns deep into the substrate 110, such as being 20 to 28 μm deep, and the DT for DT isolation can be 1.5 μm to 3.5 μm wide. As described above, the DT for DT isolation can have an enclosed shape that encloses an area of the substrate 110 to provide one or more moats. For DT-based capacitors, the DT depth may generally be 2 μms to 8 μms into the substrate 110, the DT width may generally be 0.4 μms to 1.5 μms, and the DT shape may be circular.

A deep reactive-ion etching (DRIE) etch process using fluorine chemistry may be used to remove semiconductor material of the substrate 110 to form the DTs. A trench mask may be formed over the second silicon oxide layer 123 so as to expose one or more areas for forming the DTs. The trench mask may include photoresist formed by a photolithographic process, and may further include a hard mask layer and/or an anti-reflection (AR) layer.

Figure 2B:
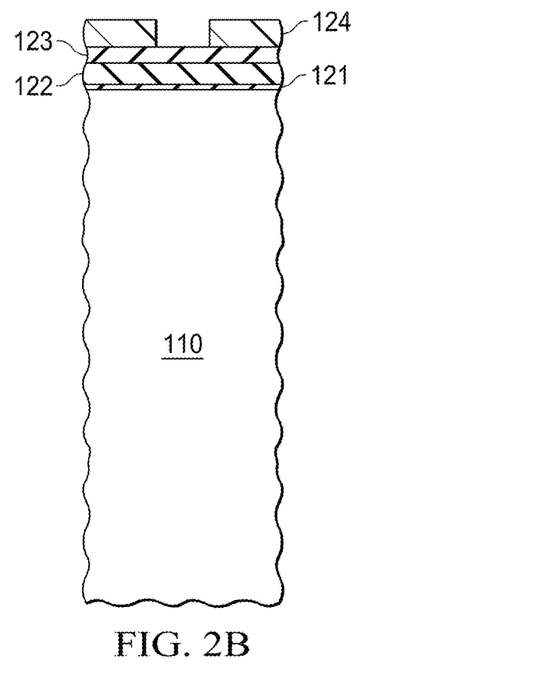
Figure 2C:
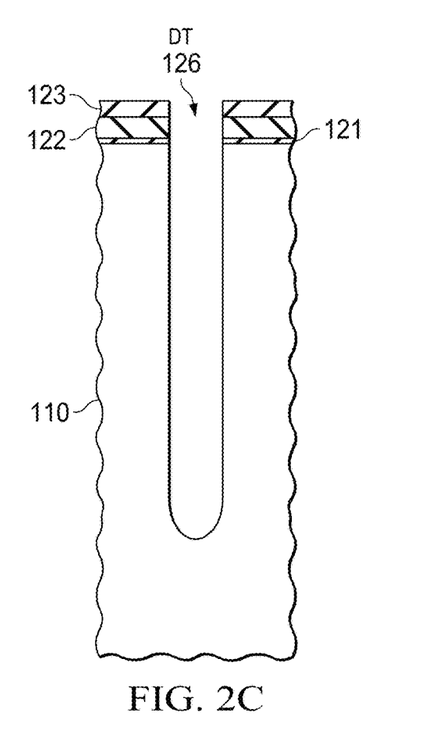

FIG. 2B is a cross-sectional diagram corresponding to the results after forming a pattern of photoresist 124 on the second silicon oxide layer 123. FIG. 2C is a cross-sectional diagram corresponding to the results after step 102 (trench (e.g., DT, etching) showing the formation of a DT 126.

The DT etch process can also comprise a two-step etch process where the second silicon oxide layer 123 functioning as a hard mask oxide layer may be first etched using a photoresist pattern to form a hard mask pattern, which can then be ashed and wet cleaned to remove the photoresist 124. Then the silicon nitride layer 122, the pad oxide layer 121 and the substrate 110 such as silicon, can all then together be etched using the hard mask pattern, generally using a process comprising DRIE.

Step 103 comprises forming a dielectric liner on sidewalls and on a bottom of the trench shown as DT 126, which can comprise a single dielectric layer, or can comprise two more dielectric layers. For example, a first liner layer 127a shown in FIG. 2D generally comprising thermal oxide may be formed from the substrate 110 on the sidewalls and the bottoms of the DTs 126. The first liner oxide layer 127a may be, for example, 50 nanometers to 400 nanometers thick. There is shown a second liner layer 127b on the first liner oxide layer 127a. For DT isolation structures the second liner layer 127b can comprise a layer of silicon oxide which may be deposited, for example, by a sub-atmospheric chemical vapor deposition (SACVD) process. For DT-based capacitors, the second liner layer 127b generally comprises silicon nitride due to its higher k-value to provide a higher capacitance per unit area.

Step 104 comprises forming a polysilicon layer on the dielectric liner layer(s), wherein the polysilicon layer fills the DT and also extends lateral to the trench (e.g., DT). The polysilicon layer can comprise a single layer, or can comprise two or more polysilicon layers. The polysilicon layer may have a thickness of about 800 nm to 2,000 nm (0.8 µms to 2 µms). The polysilicon layer thickness selected is generally based on the width of the DT, selected to more than fill the DTs. The polysilicon layer may be formed, for example, at a temperature of about 620° C. by providing 500 standard cubic centimeters per minute (sccm) to 600 sccm of silane ($SiH_4$) at a pressure of about 200 millitorr.

Figure 2D:
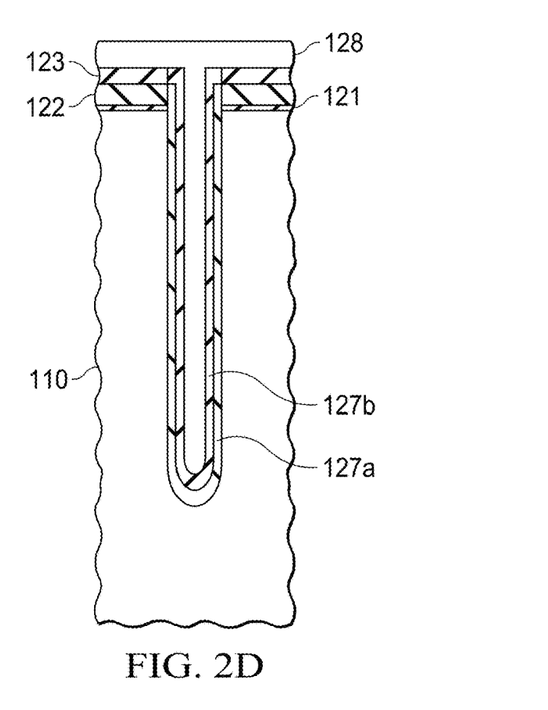

FIG. 2D is a cross-sectional diagram corresponding to the results after step 104 showing the polysilicon layer 128 typically formed by CVD within the DT on the first liner oxide layer 127a, having a second liner layer 127b on the first liner oxide layer 127a, as well as lateral to the DT. As described above, the polysilicon layer 128 generally has a sufficient thickness to more than fill the DT 126 shown in FIG. 2C to also provide polysilicon lateral to the DT.

Step 105 comprises performing a CM' process stopping on the silicon nitride layer 122 to remove the polysilicon layer 128 and the second silicon oxide layer 123 to form a polysilicon-filled trench, shown as filled DT 130. At least about 20%, such as about 30-40%, of the thickness of the silicon nitride layer 122, may be polished off by the CMP process.

Figure 2E:
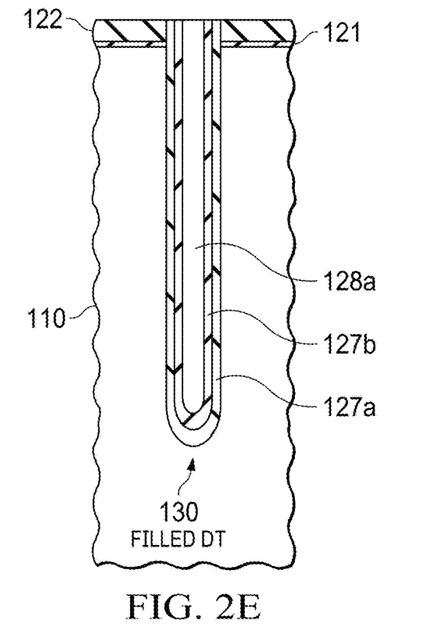

FIG. 2E is a cross-sectional diagram corresponding to the results after step 105. The CMP process can be seen to have stopped on the silicon nitride layer 122 which acts as a CMP etch stop, and there is an exposed region of the polysilicon layer now filling only the DT. The patterned polysilicon fill is now shown as 128a, and the filled DT is now shown as 130.

Step 106 comprises thermally oxidizing after the CMP processing to oxidize exposed regions of the polysilicon layer including the polysilicon fill 128a to form a polysilicon oxide layer. Example processing conditions for step 106 comprises a dry (02 as the only oxidizing gas) oxidation process that may have a target to grow about a 200 Å±30% thick silicon oxide layer as noted above when measured over a lightly doped single-crystal silicon region of a pilot wafer in the lot of product wafers processed in the same furnace as the substrate(s) 110. As described above, this thermally oxidizing which oxidizes the exposed regions of polysilicon fill 128a enables the following hot-phosphoric acid etch process step to etch away all the silicon nitride layer 122.

Figure 2F:
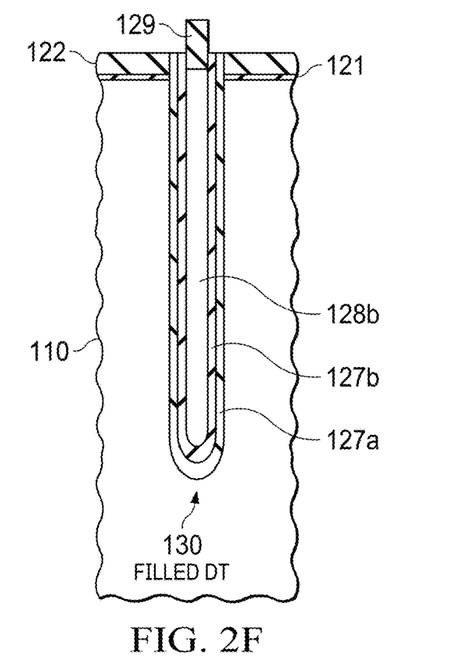

FIG. 2F is a cross-sectional diagram corresponding to the results after step 106 comprising thermally oxidizing the exposed regions of the polysilicon fill 128a to form a polysilicon oxide layer 129 over the resulting polysilicon fill of the filled DT 130. The polysilicon fill is now shown in FIG. 2F as 128b.

Figure 2G:
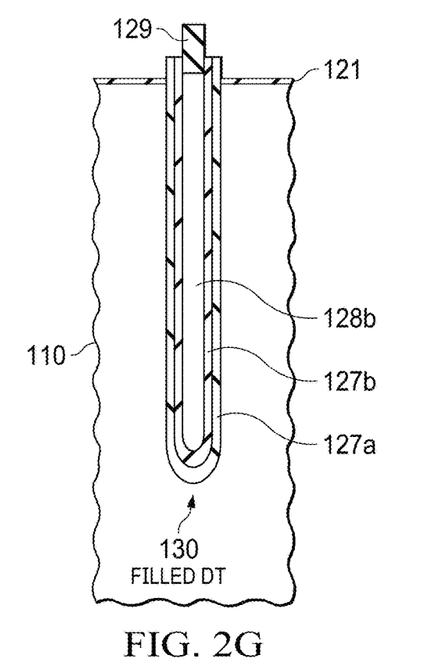

Step 107 comprises after the thermal oxidizing, removing the silicon nitride layer 122. As described above, a hot phosphoric acid solution etch process at a temperature of 150° C. to 190° C. can be used to selectively remove the silicon nitride layer 122. FIG. 2G is a cross-sectional diagram corresponding to the results after step 107 comprising removing the silicon nitride layer 122. The hot phosphoric acid etch process can be highly selective for silicon nitride layer removal relative to silicon oxide removal. That is a reason before the hot phosphoric acid etching of the silicon nitride layer 122 a short HF clean may be used to remove any silicon oxide layer that may be on top of the silicon nitride layer 122.

Step 108 comprises an oxide etch, such as using wet etch comprising dilute HF, for removing the polysilicon oxide layer 129 and the silicon oxide layer over the surface of the substrate 110 shown as the pad oxide layer 121. A new layer of thermal silicon oxide can then be grown on the surface of the substrate 110, with regions of the substrate 110 having an outer ring of DT isolation as described above referred to herein as being moats.

Figure 2H:
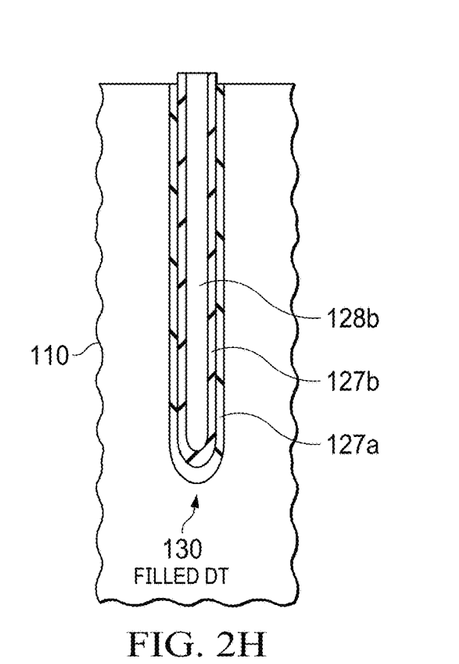

FIG. 2H is a cross-sectional diagram corresponding to the results after step 108, where the structure can be seen to no longer include the polysilicon oxide layer 129 or the pad oxide layer 121 on the surface of the substrate 110. As described in the Examples section below, disclosed processing comprises growing a polysilicon oxide layer to oxidize the exposed regions of the polysilicon fill which results in smaller liner oxide layer(s) groove depth, which helps to avoid generating silicon nitride stringers associated with a subsequent STI process that is included in certain IC process flows, such as STI processing described briefly in the paragraph below. The depth of the groove in the liner oxide layer(s) next to the polysilicon fill is generally ≤20 nms, such as being 10 nms to 20 nms deep, which may be compared to an otherwise equivalent DT formation process that lacks a disclosed oxidation of the exposed regions of the polysilicon fill, which generally results in a liner oxide layer groove depth that is at least 40 nms.

Step 109 can comprise when the filled DT 130 comprises DT isolation that has a ring-shape which encloses moats in the substrate 110, forming at least one STI region within the moats, and then forming at least one transistor within the area enclosed by the STI. After forming STI regions within the moats, transistors are formed including by implanted dopants into the moats, forming gate stacks, generally followed by multi-level metal processing, and then passivation processing.

Figure 2I:
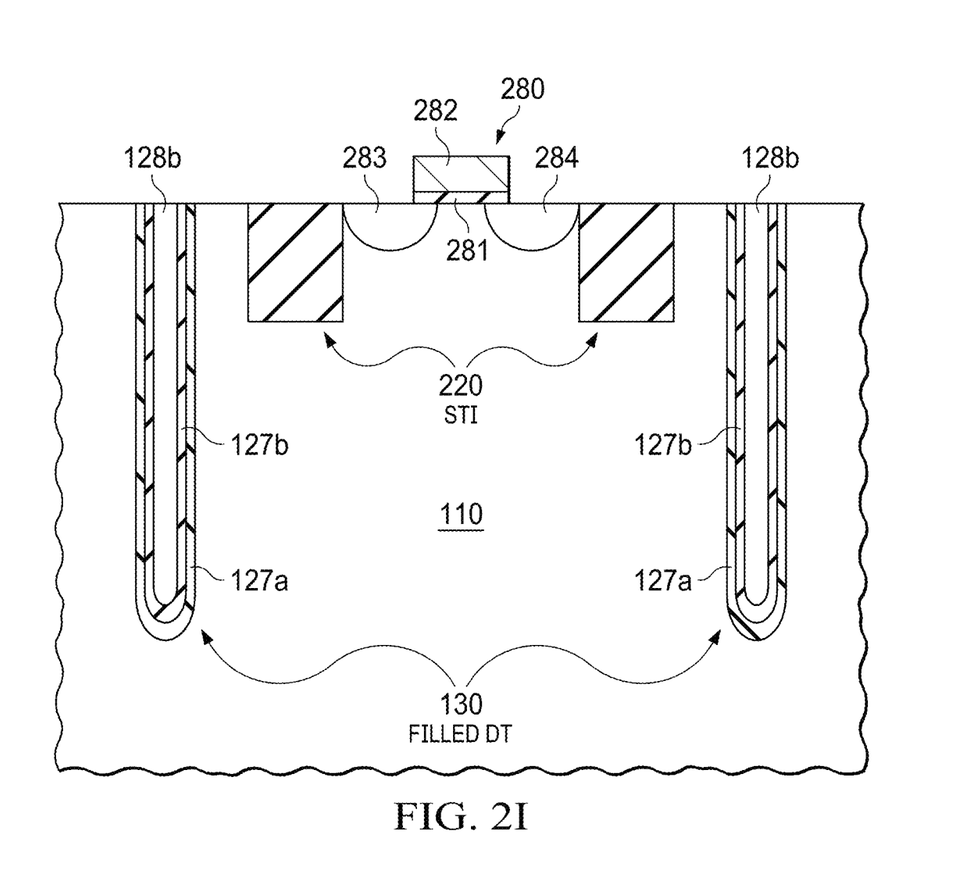

FIG. 2I is a cross-sectional diagram corresponding to the results after forming STI regions 220 and forming transistors in the moats that are positioned within the filled DT 130. The transistors are shown for simplicity as a single MOS transistor 280 which comprises a gate electrode 282 (such as comprising doped polysilicon) on a gate dielectric 281, including a source 283 and a drain 284.

Figure 3A:
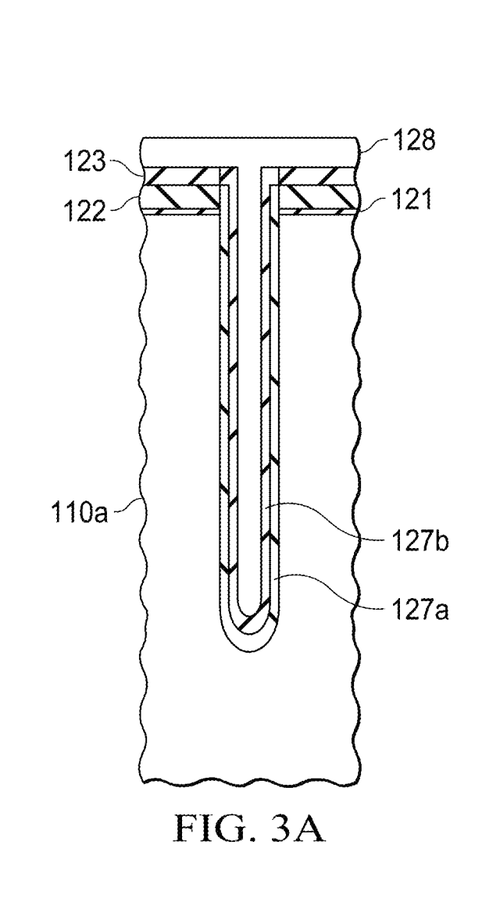
FIGS. 3A-3C are cross-sectional diagrams showing process progression for an example method of forming trench-based capacitors, where the method includes oxidizing the surface of the polysilicon fill before stripping off the silicon nitride layer, for an IC having MOS transistor(s) and trench-based capacitors, according to an example aspect.
Figure 3B:
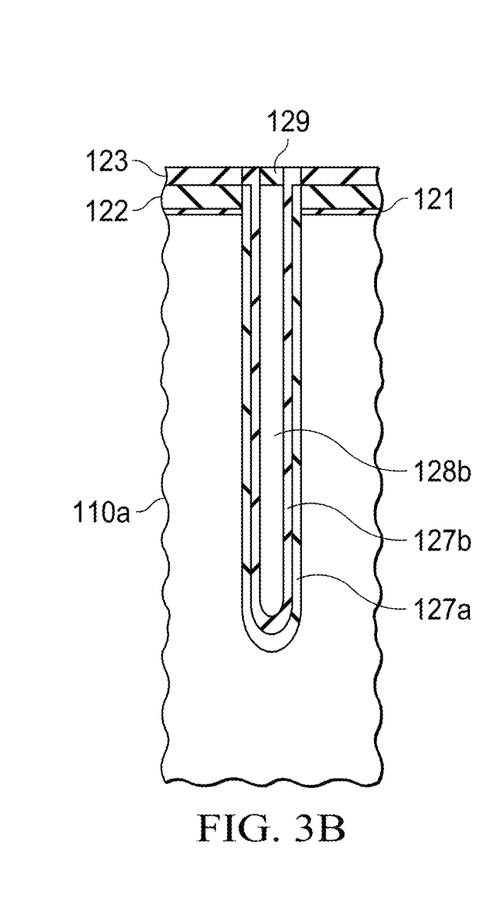
Figure 3C:
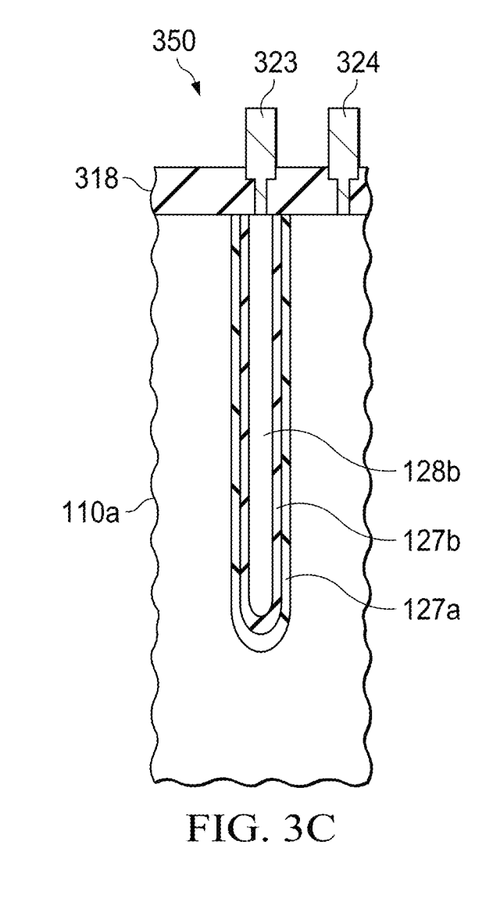

FIGS. 3A-C are cross-sectional diagrams showing process progression for an example method of forming trench-based capacitors that analogous to method 100 includes oxidizing the surface of the trenches' polysilicon fill before stripping off the silicon nitride layer. The processing described above for forming the DTs corresponding to FIGS. 2A-2C are generally also used for this process for forming DT-based capacitors, with FIG. 3A corresponding to FIG. 2D, except that the substrate surrounding the DT generally comprises a heavily doped substrate region, now shown as substrate 110a, such as a heavily n-type doped region over a layer of p-doped epitaxy, over a bulk substrate material. In addition, as described above the second liner layer 127b in the case of DT-based capacitors may also comprise silicon nitride.

In one particular example arrangement for forming DT-based capacitors the layer stack can comprise a layer of pad oxide layer 121 being a 200 Å±30% thick layer, the silicon nitride layer 122 can have a thickness of about 1,600 Å±30%, and the second oxide layer 123 can have a thickness of about 10 kÅ±30%. The DT patterning and etching can comprise forming about 6 µm deep trench(es)±30% with about a 1.2 µm diameter±30%. Although only one filled DT is shown in FIGS. 3A-3C, as known in the art DT-based capacitors can each comprise a plurality of electrically connected filled DTs.

For the DT-based capacitors, the first liner oxide layer 127a can comprise 65 Å±30% of a thermally grown dry oxide layer. The second liner layer 127b can comprise 115

Å±30% of silicon nitride. FIG. 3A shows the DT trench filled with a polysilicon layer 128 which is unpatterned that may be 1.1 µm thick and comprise in situ p-type doped polysilicon. Lateral to the DT trench is a layer stack comprising a silicon nitride layer 122, on a pad oxide layer 121, with a second silicon oxide layer 123 on top of the silicon nitride layer 122.

FIG. 3B shows the DT trench after polysilicon CMP polysilicon fill shown as 128b and then forming a layer of polysilicon oxide 129. The CMP process removes all of the polysilicon layer 128 shown in FIG. 3A over flat surfaces, except the polysilicon layer in the DT trenches to provide polysilicon fill 128b, where the CMP process stops on the silicon nitride layer 122, again acting as an etch stop. Next, about 200 Å±30% of a dry silicon oxide layer is grown at about 900° C. that forms a polysilicon oxide layer 129 over exposed regions of the polysilicon fill 128b. Silicon nitride is known to be highly inert, so that there is very little silicon oxide layer grown on top of the silicon nitride layer 122 one forming the polysilicon oxide layer 129.

A hot phosphoric acid etch is then performed for removal of the remaining portion of the silicon nitride layer 122. Because of the presence of the polysilicon oxide layer 129, the surface of the polysilicon fill 128b is protected from attack by the hot-phosphoric acid etch process. Hot-phosphoric acid is known to be very selective to silicon nitride relative to silicon oxide. The pad oxide layer 121 and the polysilicon oxide layer 129 are then generally removed using a dilute HF etch.

The process can then comprise depositing a silicon oxide layer 318. For example, the silicon oxide layer 318 can comprise a 1 µm thick deposited layer of phosphosilicate glass (PSG), followed by forming contacts comprising CMP through the silicon oxide layer 318, shown as a polysilicon fill contact 323 to the polysilicon fill 128b to provide a first capacitor plate and a substrate contact 324 to the doped region 110a of the substrate to provide a second capacitor plate. FIG. 3C shows a completed DT-based capacitor 350. As noted above, the capacitor dielectric is generally silicon nitride being the second liner layer 127b over a thermal silicon oxide being the first liner oxide layer 127a.

Figure 4:
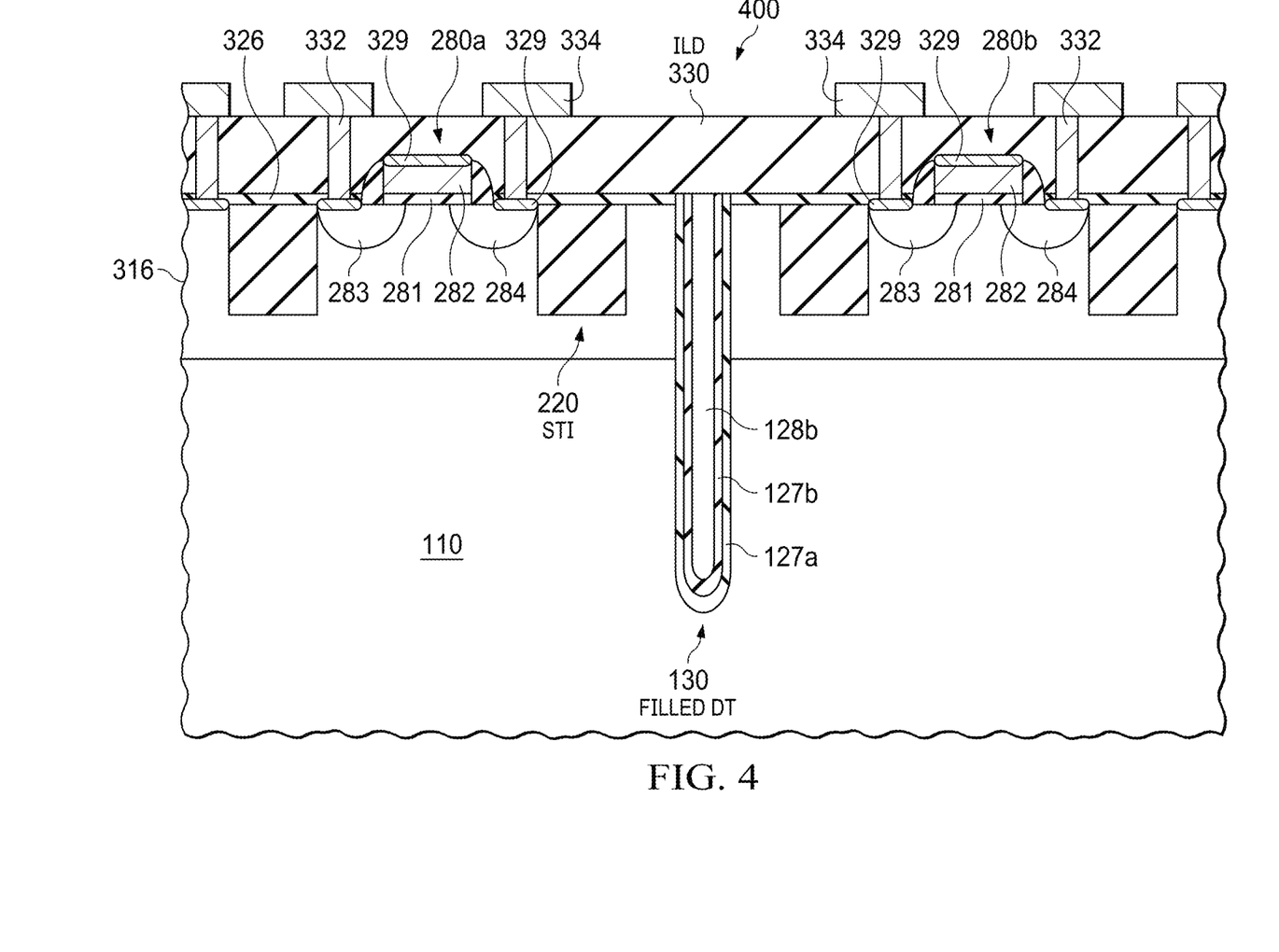
FIG. 4 is a simplified cross-sectional depiction of an IC having MOS transistor(s) including DT isolation and STI regions inside the DT isolation, according to an example aspect.

FIG. 4 is a cross-sectional view of an IC 400 showing a plurality of transistors shown as 280a and 280b separated by a filled DT 130. Alternatively, the filled DT can encircle both of the transistors 280a, 280b, with these transistors being isolated from one another by STI formed around each transistor 280a, 280b. The IC 400 has circuitry comprising circuit elements (including transistors, and generally diodes, resistors, capacitors, etc.) formed in the substrate 110 configured together for realizing at least one circuit function such as an analog function (e.g., an amplifier, power converter or power field effect transistor (FET)), radiofrequency (RF), digital, or a memory function.

The IC 400 includes a substrate 110 that as noted above can be a bulk silicon substrate, or bulk substrate having an epitaxial layer thereon. The substrate 110 can generally comprise at least one doped well, shown as well region 316 which can be formed by a conventional ion implantation or diffusion process, to provide a suitable well depth and doping profile.

The transistors 280a, 280b, are shown identical only for simplicity, that can be formed by conventional CMOS processing including deposition of gate dielectrics, followed by forming gate electrodes, such as comprising polysilicon, patterning of the materials using lithography and etching (e.g., RIE to form the gate stacks, followed by sidewall formation, e.g., silicon oxide or silicon nitride materials deposited on the gate stacks). The source regions 283 and drain regions 284 can be formed using conventional dopant or ion implantation processes that one of ordinary skill in the art would understand.

STI structures 220 are formed in the substrate 110 and more specifically around each of the transistors 280a, 280b. The STI structures 220 can be formed with the well regions 316 and can comprise a silicon oxide material, as an example. The STI structures 220 can be formed by using conventional lithography, etching and deposition steps, followed by a CM' step. The STI structures 220 can be formed prior to the formation of the transistors 280a, 280b.

There are shown to be silicide regions 329 formed on the surface of the source and drain regions 283, 284 and on the gate electrodes 282. The silicide process generally begins with deposition of a thin transition metal layer, e.g., nickel, cobalt, or titanium, over fully formed and patterned semiconductor devices (e.g., doped or ion implanted source and drain regions 283, 284 and respective transistors 280a, 280b. As known in the art, after deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 329 in the active regions of the devices, e.g., transistors 280a, 280b. A barrier layer 326 can be formed over the silicide contacts 329 in the active regions of the devices, e.g., transistors 280a, 280b. The barrier layer 326 can comprise a silicon nitride layer deposited using a CVD process.

As noted above the filled DT 130 when embodied as DT isolation are generally formed to provide a moat to surround the transistors 280a, 280b. DT isolation for some analog IC designs is also generally used for isolating low voltage (LV) circuit blocks from high voltage (HV) circuit blocks. Conventionally, field-oxide or STI has been used to isolate LV from HV circuitry, but the spacing between them needed is relatively large. DT isolation allows an IC design to shrink the spacing between LV and HV circuitry, for example, by about a factor of 6.

Following the formation of the filled DT 130, an interlevel dielectric (ILD) material 330 can be formed over the exposed surfaces of the transistors 280a, 280b and the barrier layer 326. The ILD material 330 can comprise silicon oxide deposited using a CVD process. Contacts 332 can be formed within the ILD material 330 using conventional lithography, etching and deposition of metal or metal alloy processes. The contacts 332 will be in direct contact with the silicide regions 329 over the source and drains of the transistors 280a, 280b, and no contacts to the gates are shown in FIG. 4 there will be gate contacts generally to the silicide region 329 on the gate electrodes 282. Wiring layers and other back end of the line (BEOL) said structures shown as a layer of patterned metal 334 are formed in contact with the contacts 332 using, again, conventional CMOS deposition and patterning processes. The filled DT 130 can generally be formed at any step in the IC manufacturing process, e.g., prior to the process for forming the STI 220.

Examples

Disclosed aspects are further illustrated by the following specific Examples, which should not be construed as limiting the scope or content of this Disclosure in any way.

FIG. 5A shows a scanned TEM top view image of an array of DTs surrounding moats shown as smaller moats 515 and larger moats 518 after a hot-phosphoric acid etch process for removing the silicon nitride layer 122 that followed directly after the CMP process showing residual regions of the silicon nitride layer 122 remaining in the moats. The size of the smaller moats 515 was 12 µm×12 µm measured inside the moat. As described above, the silicon nitride layer 122 residual is recognized to result because the hot phosphoric acid besides etching the silicon nitride layer 122 also etches exposed portions of the polysilicon fill which is believed to dilute the hot-phosphoric acid locally. This is results in the hot-phosphoric etch not removing as intended all the silicon nitride layer, particularly in smaller moats 515 surrounded by the filled DTs 130. As described above, for an IC process also having STI's formed within the moats, this silicon nitride layer 122 residual on the surface of the moats 515 and 518 results into surface defects that can block subsequent STI formation within the moats.

Figure 5B:
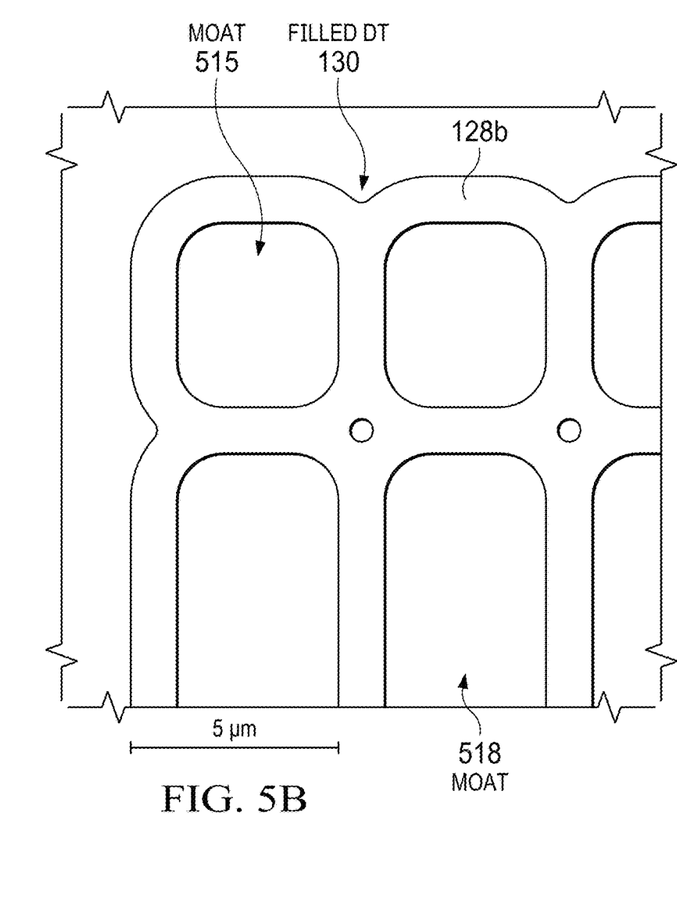
FIG. 5B is a scanned TEM image of a top side of an IC having DTs surrounding moats being the same IC portion as shown in FIG. 5A, again the IC being shown after the hot phosphoric acid strip process that is intended to remove all of the silicon nitride layer, where the hot phosphoric acid strip process followed a disclosed oxidation of the exposed surface of the DT's polysilicon fill. There is no silicon nitride layer shown on the surface of the respective moats.

FIG. 5B shows a scanned TEM image of the same array of filled DTs 130 surrounding smaller and larger moats 515 and 518 shown in FIG. 5A after a hot-phosphoric acid etch process for removing the silicon nitride layer 122. The hot phosphoric acid process followed a disclosed polysilicon fill oxide process that formed about 200 Å of dry silicon oxide (measured on a lightly doped pilot wafer) at about 900° C. over the exposed polysilicon fill after the CMP process but before using the hot phosphoric acid etch for silicon nitride layer removal. As shown, there are no identifiable regions of the silicon nitride layer remaining in the smaller and larger moats 515 and 518.

FIG. 6A shows a scanned TEM image with a 200 nm scale of a cross-section of a DT after silicon nitride CMP showing a noticeable groove in the liner oxide layer shown as liner oxide layers 127b/127a measured to be 43 nms in depth with respect to the top surface of the polysilicon fill shown as poly fill 128b, with the liner oxide layer groove located next to the polysilicon fill 128b which enlarges in depth during the removal of the pad oxide layer (shown as 121 above) formed from the oxidation of the polysilicon over the DT. This liner oxide layer groove as described above can trap the moat silicon nitride used for forming the STI regions in the moats, which is not removed after the CMP and subsequent hot phosphoric acid processing during the STI processing. This trapped silicon nitride layer remaining in the liner oxide layer groove along the perimeter of the DT can lift off as stringers during subsequent oxide wet (generally dilute HF) cleans, such as pre-gate oxidation cleans, the gate oxide clean, and the silicide block (Siblock) wet clean, that can become adhered as described above on the moats, resulting into nitride stringers. These silicon nitride stringers can be either trapped under the gate polysilicon, or if over the moat can block silicidation of polysilicon and/or silicon source/drain regions of the substrate, that can result into MOS device leakage.

The change in resistance due to the presence of the silicon nitride stringers depends when these silicon nitride stringers lift-off, and where they end up over un-intended areas of the IC. If this happens during dummy gate oxidation or the pre-gate oxidation clean steps then the stringers can reduce gate oxide quality, which can result in gate to substrate leakage. However, if the silicon nitride layer lift-off happens at the Siblock clean after gate polysilicon, then the stringers can block silicidation which can result in highly resistive source, drain, or gate regions. This increase in resistance can result into malfunction of MOS transistors, and thus malfunction of the IC.

FIG. 6B shows that the groove in the liner oxide layers 127b/127a next to the polysilicon fill 128b is much smaller, now measured to be 13 nms deep with respect to the surface of the polysilicon fill 128b. When as disclosed herein a polysilicon oxide layer is grown over the polysilicon fill before the DT silicon nitride layer strip process that generally comprises hot phosphoric acid etching, the depth of the liner oxide layer groove is thus significantly shallower (liner oxide layer(s) groove depth shown reduced about 70%) as compared to the depth of the liner oxide layer groove when lacking a disclosed oxidation of the exposed regions of the polysilicon fill, as shown in FIG. 6A described above.

An explanation is now provided as to the reasons for a significant reduction in liner oxide layer groove depth shown in FIG. 6B for processing including disclosed oxidation of the exposed regions of the polysilicon fill as compared to the liner oxide layer groove depth shown in FIG. 6A that resulted from a baseline DT formation process. Disclosed oxidation of the exposed surface of the polysilicon fill as described above grows about 200 Å±30% of polysilicon oxide on top of the polysilicon fill which results in the top edge of the DT polysilicon fill shape being rounded. Because the height of polysilicon fill is generally slightly more than the DT liner oxide right after CMP, the disclosed polysilicon oxidation also suppresses the polysilicon height as well and makes the edges of the polysilicon fill more rounded as some DT polysilicon fill is consumed during the polysilicon oxidation process. When the wafers are then processed using a HF clean and hot-phosphoric acid, there is more silicon oxide layer thickness to etch right at the edge of the polysilicon fill with respect to the liner oxide layer(s) removal resulting in the groove having less depth. Accordingly, rounded DT polysilicon fill corners and more oxide over the polysilicon fill helps in reducing the depth of the liner oxide layer(s) groove.

Regarding FIG. 6A, the baseline DT process that received no polysilicon fill oxidation process before hot phosphoric acid etching, thus had no polysilicon fill oxide grown, that when subjected to the same HF etch process (to remove oxide) etches the liner oxide at the same time the HF arrives at a polysilicon fill wall and starts etching the liner oxide layer(s) along the walls of polysilicon fill. The HF etch process functions as a two dimensional etch at the corner of the DT which results in the liner oxide layer(s) groove being significantly deeper at the end of HF etch processes.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure. For example, it may be possible to substitute the silicon nitride layer with another non-silicon oxide layer, such as a silicon carbide layer.

The invention claimed is:

1. A method of fabricating an integrated circuit (IC), comprising:

forming a layer stack on a substrate, the layer stack comprising silicon nitride layer on a first silicon oxide layer, with a second silicon oxide layer on the silicon nitride layer, the substrate comprising a semiconductor material having a top surface;

etching through the layer stack to form at least one trench into the semiconductor material;

forming a dielectric liner on sidewalls and on a bottom of the trench;

forming a polysilicon layer on the dielectric liner, wherein the polysilicon layer fills the trench and extends over the top surface;

performing a chemical mechanical planarization (CMP) process stopping on the silicon nitride layer to remove the polysilicon layer and the second silicon oxide layer to form a trench structure having a polysilicon fill;

after the CMP processing, thermally oxidizing the polysilicon layer to form a fill silicon oxide layer having a bottom surface above the top surface of the substrate; and after forming the fill silicon oxide layer, removing the silicon nitride layer and the fill silicon oxide layer, thereby exposing the polysilicon fill.

2. The method of claim 1, wherein the trench extends 5 µm to 30 µm into the semiconductor material, and wherein the trench structure comprises a trench isolation that is ring-shaped which provides an enclosed area of the semiconductor material.

3. The method of claim 2, further comprising forming at least one shallow trench isolation (STI) region inside the enclosed area, the STI region enclosing at least one transistor.

4. The method of claim 1, wherein the trench extends 2 µm to 8 µm into the semiconductor material, wherein the polysilicon fill is doped, further comprising forming a contact to the polysilicon fill and a contact to the semiconductor material that surrounds trench structure, and wherein the trench structure comprises a trench-based capacitor.

5. The method of claim 4, wherein the dielectric liner comprises a silicon nitride layer over a silicon oxide layer, the silicon nitride layer and the silicon oxide layer providing a capacitor dielectric for the trench-based capacitor.

6. The method of claim 1, wherein the removing comprises using a phosphoric acid etch solution that is performed at a temperature from 150° C. to 190° C.

7. The method of claim 1, further comprising a wet oxide etch for removing the fill silicon oxide layer after the removing of the silicon nitride layer.

8. The method of claim 1, wherein a thickness of the fill silicon oxide layer is in a range from 10 nm to 30 nm.

9. The method of claim 1, wherein the etching through the layer stack and forming the at least one trench comprises a two-step etch process comprising:

a first etch process wherein the second silicon oxide layer functioning as a hard mask oxide is etched using a photoresist pattern to form a hard mask pattern, which is then ashed and wet cleaned to remove the photoresist pattern, and a second etch process after the first etch process whereby the silicon nitride layer, the first silicon oxide layer, and the substrate are etched using the hard mask pattern by an etch process comprising deep reactive-ion etching (DRIE).

10. The method of claim 1, wherein a thickness of the polysilicon layer as deposited is in a range from 800 nm to 2 µm.

11. The method of claim 1, wherein the CMP processing stopping on the silicon nitride layer removes at least 20% of a thickness of the silicon nitride layer.

12. A method of fabricating an integrated circuit (IC), comprising:

forming a layer stack on a silicon substrate, the layer stack comprising a silicon nitride layer on a first silicon oxide layer, with a second silicon oxide layer on the silicon nitride layer;

a first etch process wherein the second silicon oxide layer functioning as a hard mask oxide is etched using a photoresist pattern to form a hard mask pattern, which is then ashed and wet cleaned to remove the photoresist pattern;

after the first etch process, a second etch process comprising deep reactive-ion etching (DRIE) etching through the silicon nitride layer and first silicon oxide layer and into the silicon substrate to form at least one deep trench (DT) that is at least 2 µm deep into the silicon substrate;

forming a dielectric liner on sidewalls and on a bottom of the DT comprising a second liner layer on a first liner layer comprising a thermal oxide layer;

forming a polysilicon layer on the dielectric liner, wherein the polysilicon layer fills the DT and extends lateral to the DT;

chemical mechanical planarization (CMP) processing stopping on the silicon nitride layer to remove the polysilicon layer and the second silicon oxide layer to form a DT structure having a polysilicon fill;

thermally oxidizing comprising a dry oxidation process at a temperature from 850° C. to 950° C. after the CMP processing to oxidize exposed regions of the polysilicon fill thereby forming a fill silicon oxide layer having a bottom surface above a top surface of the silicon substrate;

after forming the fill silicon oxide layer, removing the silicon nitride layer using a hot phosphoric acid solution performed at a temperature in a range from 150° C. to 190° C.;

wet etching to remove the fill silicon oxide layer and exposing the polysilicon fill; and forming at least one transistor extending into the silicon substrate.

13. The method of claim 12, wherein the DT extends 5 µm to 30 µm into the silicon substrate, and wherein the DT structure is a DT isolation structure that is ring-shaped which provides an enclosed area of the silicon substrate, further comprising forming at least one shallow trench isolation (STI) region inside the enclosed area.

14. The method of claim 12, wherein the DT extends 2 µm to 8 µm into the silicon substrate, wherein the polysilicon fill is doped, further comprising forming a contact to the polysilicon fill and a contact to the silicon substrate that surrounds DT structure, and wherein the DT structure comprises a DT-based capacitor.

15. The method of claim 14, wherein the dielectric liner comprises silicon nitride layer and a silicon oxide layer that provides a capacitor dielectric for the DT-based capacitor.

16. The method of claim 14, wherein a thickness of the fill silicon oxide layer is in a range from 10 nm to 30 nm.

17. The method of claim 12, wherein a thickness of the polysilicon layer as deposited is in a range from 800 nm to 2 µm.

18. The method of claim 12, wherein the CMP processing stopping on the silicon nitride layer removes at least 20% of a thickness of the silicon nitride layer.

19. A method of fabricating an electronic device, comprising:
- forming a trench in a semiconductor substrate around an enclosed area, the trench extending through a first silicon oxide layer, a second silicon oxide layer and a silicon nitride layer between the first and second silicon oxide layers;
- filling the trench with polysilicon that extends over a surface of the first silicon oxide layer;
- removing the polysilicon over the surface of the first silicon oxide layer and removing the first silicon oxide layer, thereby exposing the silicon nitride layer and forming an exposed portion of the polysilicon at a top of the trench;
- oxidizing the exposed portion of the polysilicon, thereby forming a silicon oxide cap at the top of the trench and having a bottom surface above a top surface of the semiconductor substrate;
- selectively removing the silicon nitride layer thereby exposing the second silicon oxide layer; and
- removing the second silicon oxide layer and the silicon oxide cap, thereby exposing the polysilicon at the top of the trench.

20. The method of claim 19, further comprising forming a transistor extending into the semiconductor substrate in the enclosed area.

\* \* \* \* \*